(12) United States Patent
Lee et al.

(10) Patent No.: US 12,379,328 B2
(45) Date of Patent: Aug. 5, 2025

(54) INSPECTION SYSTEM AND INSPECTION METHOD FOR SEMICONDUCTOR DEVICE

(71) Applicant: SAMSUNG ELECTRONICS CO., LTD., Suwon-si (KR)

(72) Inventors: Wookjin Lee, Suwon-si (KR); Ghilgeun Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 344 days.

(21) Appl. No.: 18/118,350

(22) Filed: Mar. 7, 2023

(65) Prior Publication Data

US 2023/0333027 A1   Oct. 19, 2023

(30) Foreign Application Priority Data

Apr. 15, 2022 (KR) .................. 10-2022-0046977

(51) Int. Cl.
*G01N 21/95* (2006.01)
*H01L 21/67* (2006.01)

(52) U.S. Cl.
CPC ... *G01N 21/9501* (2013.01); *H01L 21/67248* (2013.01); *G01N 2201/12* (2013.01)

(58) Field of Classification Search
CPC .......... G01N 21/9501; G01N 2201/12; G01N 21/8806; H01L 21/67248; H01L 22/12; H01L 21/67098; H01L 21/67742; H01L 21/68757; G01R 31/2874; G01R 31/311; G01R 1/07314; G01R 31/2879; H10N 10/13; H10N 10/17

See application file for complete search history.

(56) References Cited

U.S. PATENT DOCUMENTS

| | | | |
|---|---|---|---|
| 5,198,752 A | 3/1993 | Miyata et al. | |
| 7,102,374 B2 | 9/2006 | Cader et al. | |
| 7,330,041 B2 | 2/2008 | McFadden | |
| 7,504,845 B2 | 3/2009 | Cader et al. | |
| 8,766,656 B2 | 7/2014 | Malik et al. | |
| 11,378,619 B2 * | 7/2022 | Sameshima | G01R 31/2891 |
| 11,754,510 B2 * | 9/2023 | Yoon | H01L 21/67288 |
| | | | 356/237.2 |
| 2014/0361799 A1 | 12/2014 | Graupera et al. | |
| 2021/0190860 A1 | 6/2021 | Sameshima | |
| 2022/0034959 A1 * | 2/2022 | Arai | G01R 31/308 |

FOREIGN PATENT DOCUMENTS

CN   111929248 A   11/2020

* cited by examiner

*Primary Examiner* — Hung V Nguyen
(74) *Attorney, Agent, or Firm* — Sughrue Mion, PLLC

(57) ABSTRACT

An optical failure detection system includes a test chamber having an accommodating space therein, the test chamber including an upper cover having an opening therein; a substrate plate provided in the opening of the upper cover, the substrate plate including: a first surface on which a wafer is disposed; a second surface opposite to the first surface; and an optical window formed in a central region of the substrate plate and through which the wafer is exposed; a temperature control device including a plurality of thermoelectric devices provided around the optical window of the substrate plate, the temperature control device being configured to heat or cool at least one semiconductor device of the wafer; and an optical device provided in the accommodating space of the test chamber, the optical device being configured to radiate light toward the at least one semiconductor device through the optical window.

20 Claims, 8 Drawing Sheets

INSPECTION SYSTEM AND INSPECTION METHOD FOR SEMICONDUCTOR DEVICE

CROSS-REFERENCE TO RELATED APPLICATION(S)

This application is based on and claims priority under 35 U.S.C. § 119 to Korean Patent Application No. 10-2022-0046977, filed on Apr. 15, 2022, in the Korean Intellectual Property Office, the disclosure of which is herein incorporated by reference in its entirety.

BACKGROUND

1. Field

The present disclosure relates to an inspection system and an inspection method for a semiconductor device, and, in particular, to a system for analyzing optical defects of semiconductor devices formed on a wafer, and an optical defect inspection method for semiconductor devices using the same.

2. Description of Related Art

As a size of unit logic of a semiconductor device decreases, there is a limit to physically visualizing actual failures. Optical fault isolation (OFI) analysis that uses various optical techniques to find the cause of a device failure is used as one of electrical failure analysis methods. However, since the related art OFI analysis technology can analyze only at room temperature, it may be difficult to be used for defective analysis of automotive electronic products that require high-temperature quality assurance. Thus, there is a need for a new optical defect detection system capable of detecting defects in a high or low temperature range, thereby improving product yield.

SUMMARY

One or more example embodiments provide an optical defect detection system for a semiconductor device capable of preventing yield loss due to defects occurring at a specific temperature.

Further, one or more example embodiments provide a method of detecting a defective position of a semiconductor device using the optical defect detection system.

Additional aspects will be set forth in part in the description which follows and, in part, will be apparent from the description, or may be learned by practice of the presented embodiments.

According to an aspect of an example embodiment, an optical failure detection system includes: a test chamber having an accommodating space therein, the test chamber including an upper cover having an opening therein; a substrate plate provided in the opening of the upper cover, the substrate plate including: a first surface on which a wafer is disposed; a second surface opposite to the first surface; and an optical window formed in a central region of the substrate plate and through which the wafer is exposed; a temperature control device including a plurality of thermoelectric devices provided around the optical window of the substrate plate, the temperature control device being configured to heat or cool at least one semiconductor device of the wafer; and an optical device provided in the accommodating space of the test chamber, the optical device being configured to radiate light toward the at least one semiconductor device through the optical window, and analyze light reflected from the at least one semiconductor device.

According to an aspect of an example embodiment, an optical failure detection system includes: a test chamber having an accommodating space therein, the test chamber including an upper cover; a substrate plate provided in the upper cover, the substrate plate including an optical window; a temperature control device provided in the substrate plate, the temperature control device including a plurality of thermoelectric devices provided around the optical window of the substrate plate, and the temperature control device being configured to heat or cool at least one semiconductor device of a wafer that is disposed on the substrate plate and exposed through the optical window; and an optical device provided within the accommodating space of the test chamber, the optical device configured to radiate light toward the at least one semiconductor device through the optical window, and analyze light reflected from the at least one semiconductor device.

According to an aspect of an example embodiment, nn optical failure detection method includes: arranging a wafer on a substrate plate provided in an upper cover of a test chamber, the substrate plate including an optical window; heating or cooling, by at least one of a plurality of thermoelectric devices provided around the optical window of the substrate plate, at least one semiconductor device of the wafer exposed through the optical window; applying an electrical signal to the at least one semiconductor device; and detecting, by an optical device provided within the test chamber, an optically defective position of the at least one semiconductor device exposed through the optical window.

BRIEF DESCRIPTION OF THE DRAWINGS

The above and other aspects, features, and advantages of certain example embodiments of the present disclosure will be more apparent from the following description taken in conjunction with the accompanying drawings, in which.

DETAILED DESCRIPTION

Hereinafter, example embodiments will be explained in detail with reference to the accompanying drawings.

Figure 1:
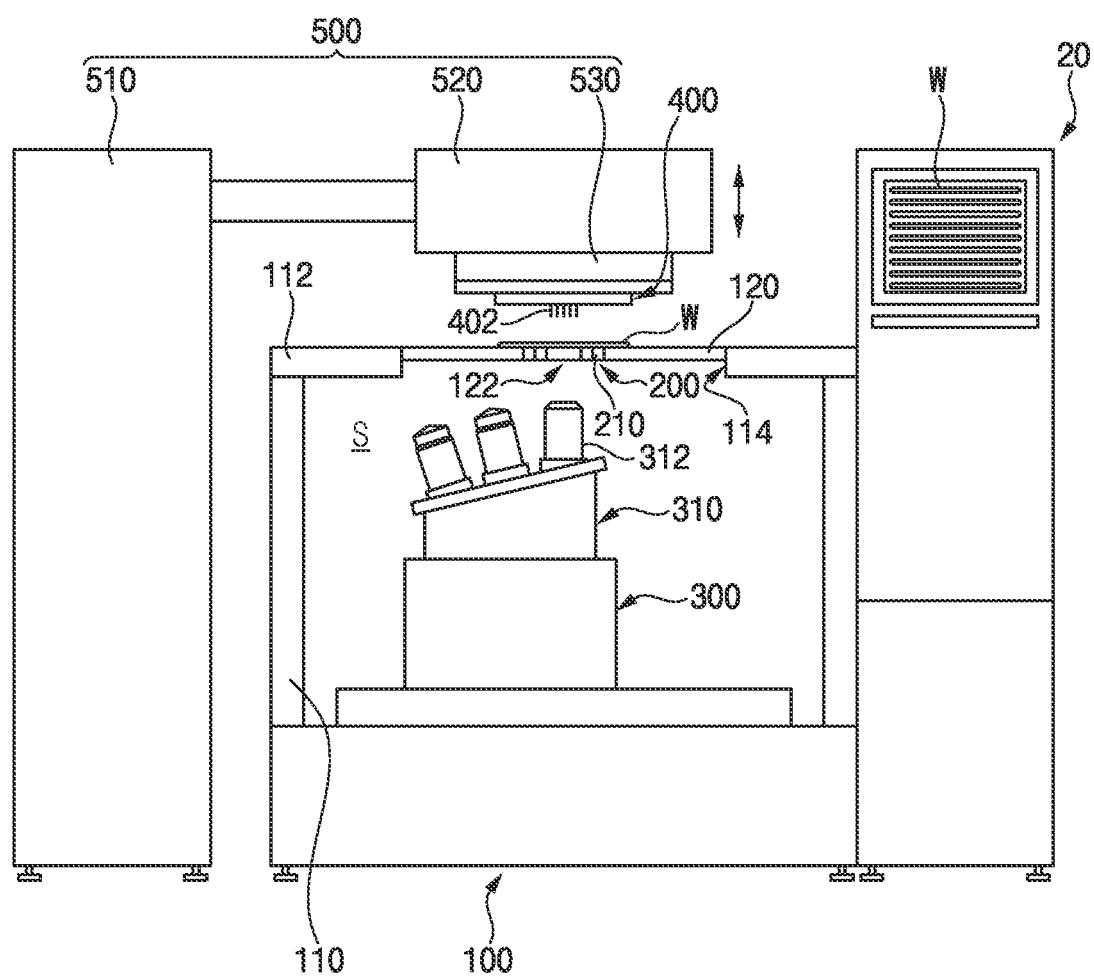
FIG. 1 is a cross-sectional view illustrating an optical defect detection system in accordance with an example embodiment.
Figure 2:
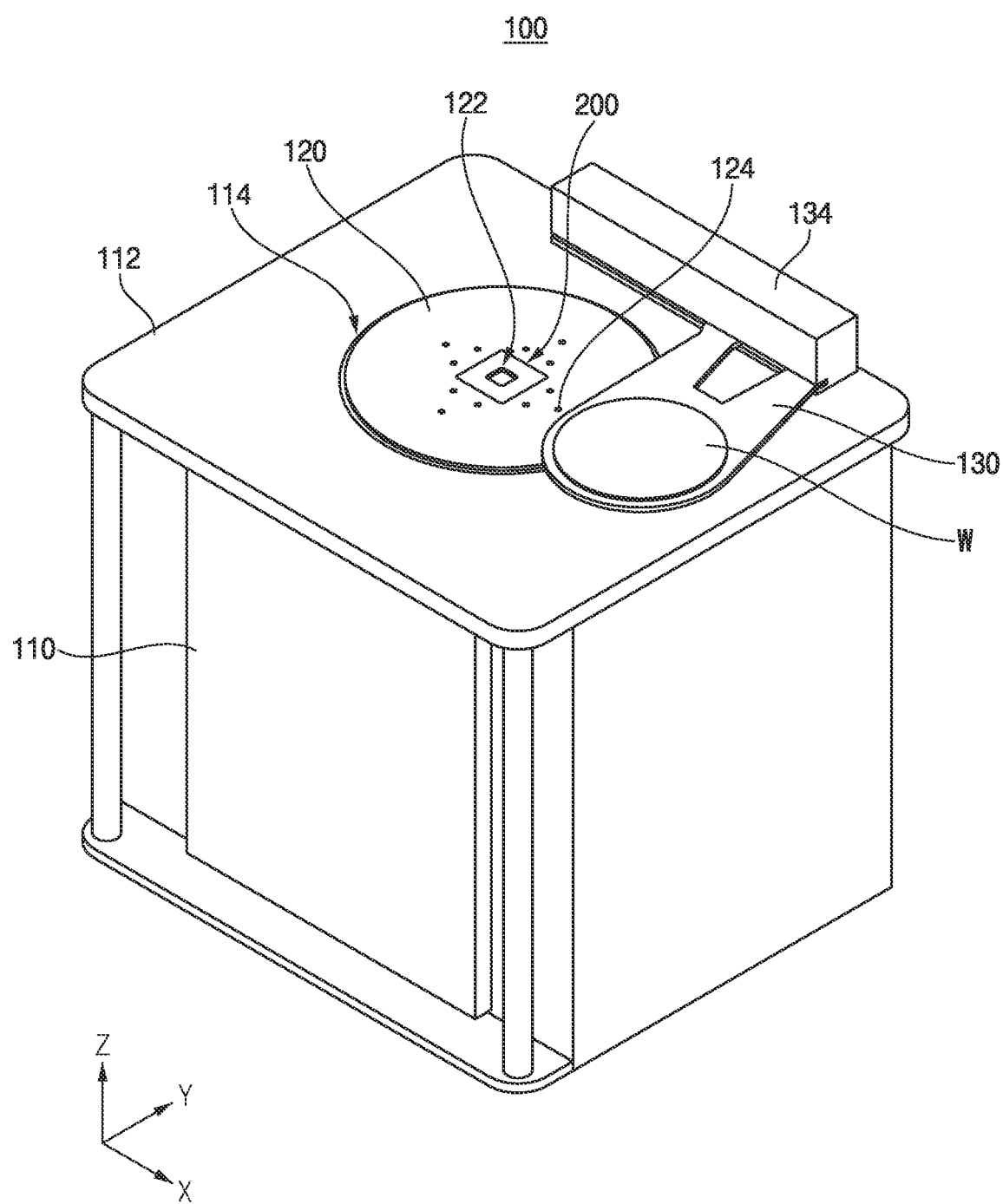
FIG. 2 is a diagram illustrating a test chamber in FIG. 1 in accordance with an example embodiment.
Figure 3:
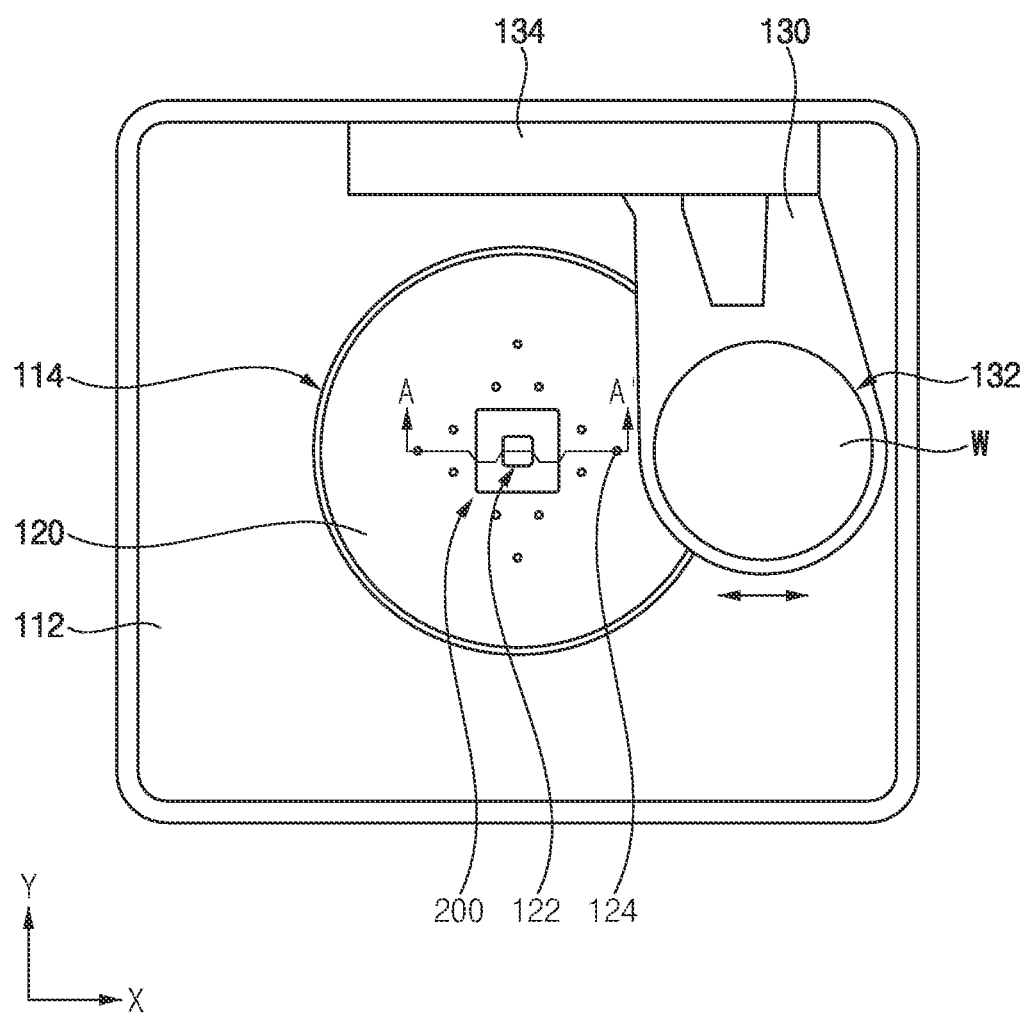
FIG. 3 is a diagram illustrating a transfer arm movable on an upper cover of the test chamber in FIG. 2 in accordance with an example embodiment.
Figure 4:
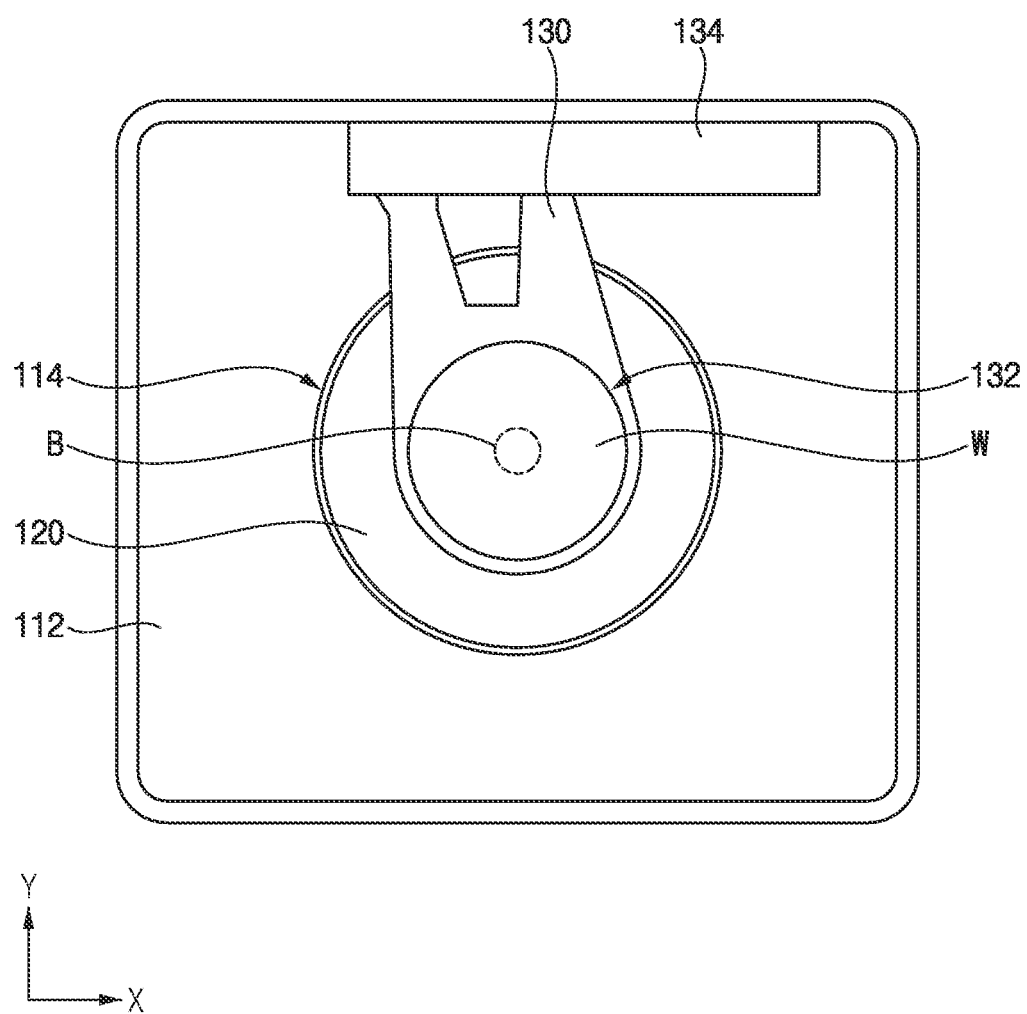
FIG. 4 is a diagram illustrating the transfer arm in FIG. 3, wherein the transfer arm is positioned on a substrate plate mounted in the upper cover in accordance with an example embodiment.
Figure 5:
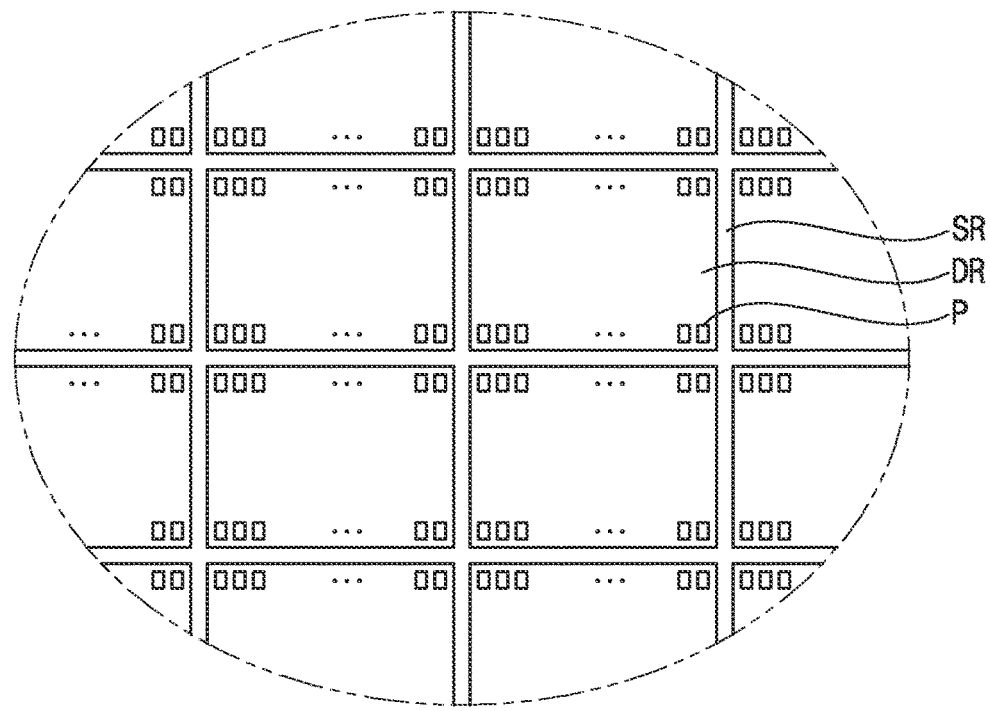
FIG. 5 is a diagram illustrating portion 'B' of a wafer of FIG. 4 in accordance with an example embodiment.

FIG. 1 is a cross-sectional view illustrating an optical defect detection system in accordance with an example embodiment. FIG. 2 is a diagram illustrating a test chamber in FIG. 1 in accordance with an example embodiment. FIG. 3 is a diagram illustrating a transfer arm movable on an upper cover of the test chamber in FIG. 2 in accordance with an example embodiment. FIG. 4 is a diagram illustrating the transfer arm in FIG. 3, wherein the transfer arm is positioned on a substrate plate mounted in the upper cover in accordance with an example embodiment. FIG. 5 is a diagram illustrating portion 'B' of a wafer of FIG. 4 in accordance with an example embodiment 4.

Referring to FIGS. 1 to 5, an optical defect detection system 10 may include a test chamber 100 having a substrate plate 120 for supporting a substrate, such as a wafer W, a temperature control device 200 configured to heat or cool a local area of the wafer supported on the substrate plate 120 to a desired temperature range, and an optical device 300 configured to photograph a semiconductor device formed on the wafer through a rear surface of the wafer exposed through an optical window 122 of the substrate plate 120.

In addition, the optical defect detection system 10 may further include a loader 20 configured to accommodate the wafer W on which semiconductor devices that are devices under test (DUTs) are formed respectively, a probe card 400 for electrical and physical contact with the semiconductor device of the wafer supported on the substrate plate 120, and a tester 500 configured to output an electrical signal for testing the semiconductor device through the probe card 400.

In example embodiments, the optical defect detection system 10 may be an optical fault isolation (OFI) system for detecting a defective position of a semiconductor device using various optical analysis methods. As will be described later, the optical defect detection system 10 may be coupled with automatic test equipment (ATE) under a desired high or low temperature range to visually provide a defective position through a high magnification lens while the semiconductor operates.

As illustrated in FIGS. 1 and 2, the test chamber 100 may provide a space in which an OFI process for a semiconductor device is performed. The test chamber 100 may include a housing that constitutes an exterior part and forms the space. The housing may include a bottom portion, a plurality of sidewalls 110 extending upwardly from the bottom portion, and an upper cover 112 connected to the sidewalls 110 and disposed on the sidewalls 110 to provide an accommodating space S. The bottom portion may have sufficient thickness and rigidity to absorb external vibrations or shocks.

An opening 114 may be provided in the upper cover 112. The substrate plate 120 may be mounted in the opening 114 of the upper cover 112. The substrate plate 120 may have an upper surface on which the wafer W is disposed and a lower surface opposite to the upper surface. The substrate plate 120 may have a circular plate shape. The substrate plate 120 may include a metal or a metal alloy. For example, the substrate plate 120 may include an aluminum alloy such as duralumin.

An optical window 122 may be formed in a central region of the substrate plate 120. The optical window 122 may include a through hole penetrating through the substrate plate 120. Alternatively, the optical window 122 may include a thermally conductive transparent material disposed within the through hole. A diameter of the optical window 122 may be within a range of about 1 cm to about 5 cm.

As will be described later, the wafer W on which a plurality of semiconductor devices is formed may be supported on the upper surface of the substrate plate 120, and the wafer W may be arranged such that at least one semiconductor device of the plurality of semiconductor devices is exposed through the optical window 122. The optical device 300 may photograph the semiconductor device exposed through the optical window 122 of the substrate plate 120 to perform OFI.

In example embodiments, the loader 20 may be disposed adjacent to one side of the test chamber 100, and may load/unload the DUT, such as the wafer W, on the substrate plate 120 that is mounted in the upper cover 112 of the test chamber 100. The loader 20 may include a substrate receiving part for accommodating a substrate transfer carrier, such as a front opening universal pod (FOUP), in which a plurality of wafers W is accommodated, and a substrate transfer mechanism for loading the wafer W from the substrate accommodating part onto the substrate plate 120.

As illustrated in FIGS. 3 and 4, the substrate transfer mechanism may include a transfer arm 130 configured to transfer the wafer W over the substrate plate 120 while holding the wafer W. A mounting hole 132 may be formed in one end of the transfer arm 130, and the wafer W may be held in the mounting hole 132. The transfer arm 130 may move along a transfer rail 134 in a first horizontal direction (e.g., the X direction). The transfer arm 130 may move in a second horizontal direction (e.g., the Y direction) along another transfer rail. The first and second horizontal directions may be substantially parallel to a plane of the wafer. The transfer arm 130 may include a reinforced plastic material.

Accordingly, the transfer arm 130 may hold the wafer W, move the wafer W onto the substrate plate 120, and unload the wafer W on which an inspection process is completed to the substrate plate 120. In addition, the transfer arm 130 may move on the substrate plate 120 in the first horizontal direction or the second horizontal direction to select at least one among a plurality of semiconductor devices such that the selected semiconductor device is exposed through the optical window 122 of the substrate plate 120.

A plurality of suction holes 124 (see FIG. 8) may be formed in the upper surface of the substrate plate 120. The wafer W may be vacuum-adsorbed by the suction holes 124 formed in the substrate plate 120. The suction holes may be connected to a vacuum pump through pipes. The vacuum pump may be connected to a controller and may provide vacuum pressure to the suction holes under the control of the controller to adsorb the wafer W.

Additionally, a plurality of gas supply holes may be formed in the upper surface of the substrate plate 120. After the inspection process for the wafer W is completed, a gas may be supplied to a back surface of the wafer W on the substrate plate 120 through the gas supply holes, and the transfer arm 130 may unload the wafer W on which the inspection process is completed to the substrate receiving part.

In example embodiments, the optical device 300 may be disposed inside the accommodation space S of the test chamber 100. The optical device 300 may radiate light onto the at least one semiconductor device exposed through the optical window 122 of the substrate plate 120 and detect a defective position from light reflected from the semiconductor device.

The optical device 300 may be installed to be movable in a horizontal direction (e.g., the X direction or the Y direction) or a vertical direction on the bottom of the test chamber 100 by a transfer device.

The optical device 300 may include an optical microscope using a laser light source. The optical microscope may include a lens turret 310 on which a plurality of lenses 312 are mounted. As the lens turret 310 rotates, any one of the plurality of lenses 312 may be selected to obtain an image having a desired magnification.

The optical defect detection system 10 may further include a cooling device for maintaining the inside of the optical device 300 under a low temperature in order to secure quality of the image having a desired magnification. For example, the cooling device may use a liquid nitrogen refrigerant to cool a camera box in which the optical lens is disposed to an absolute temperature of about 87K.

In example embodiments, the tester 500 may be electrically connected to the wafer W supported on the substrate plate 120 via the probe card 400 to output an electrical signal for inspection of the semiconductor device. The tester 500 may include a tester body 510, a tester head 520, and an interface module 530.

The tester body 510 may be disposed in a side of the test chamber 100. The tester body 510 may output an electrical signal for testing the semiconductor device, and receive an electrical signal of a test result to determine whether or not the semiconductor device operates normally.

The tester head 520 may be electrically connected to the probe card 400 over the test chamber 100 and may transmit the electrical signal between the probe card 400 and the tester body 510. The tester head 520 may move up and down over the test chamber 100 and may be selectively docked to the probe card 400. The tester head 520 may be electrically connected to the tester body 510. The tester head 520 may have the interface module 530 to which the probe card 400 is connected, and the tester head 520 may transmit the electrical signal between the probe card 400 connected to the interface module 530 and the tester body 510.

A pogo block may be provided inside the interface module 530. A plurality of pogo pins may be provided in the pogo block to be electrically connected to a conductive pattern formed on a circuit board of the probe card 400. Accordingly, the electrical signal from the tester body 510 may be sequentially transmitted to the probe card 400 via the pogo pins of the tester head 520 and the interface module 530.

As illustrated in FIG. 5, the wafer may include a die region DR and a scribe lane region SR surrounding the die region DR. Semiconductor devices may be respectively formed in the die regions DR of the wafer W through a fabrication process. The semiconductor devices are divided along the scribe lane region SR, and then, may be manufactured as individual unit chips through an assembly process.

An inspection process may be performed between the fabrication process and the assembly process to inspect electrical and physical characteristics of the semiconductor devices formed on the wafer W. In the inspection process, an electrical signal may be applied to electrode pads P provided along a periphery of the semiconductor device.

While the probe card 400 is coupled to the interface module 530, the probe card 400 may move toward the wafer W, and probes 402 of the probe card 400 may contact the electrode pads P of the semiconductor device formed on the wafer W that is placed on the substrate plate 120, respectively. Then, OFI analysis of the semiconductor device may be performed. The method of contacting the probes of the probe card with the electrode pads of the semiconductor device may not be limited thereto, and various methods may be used.

In example embodiments, the temperature control device 200 may locally heat or cool only the semiconductor device exposed by the optical window 122 of the substrate plate 120, such that the OFI analysis is performed under a desired temperature range. The temperature control device 200 may include a plurality of thermoelectric devices 210 provided on the substrate plate 120 and disposed around the optical window 122. The temperature control device 200 may accurately and quickly change the temperature of only the semiconductor device to be analyzed using the thermoelectric characteristics of the Peltier device.

For the OFI analysis, the wafer W may be disposed such that at least one semiconductor device is exposed through the optical window 122 on the first surface of the substrate plate 120. The tester 500 as the automated test system may apply an electrical signal to the semiconductor device through the probe card 400. When the semiconductor device operates in response to the electrical signal, the optical device 300 may photograph the rear surface of the wafer W through the optical window 122 using the optical lens to detect a defective position. Since the upper surface (e.g., upper surface 51 of FIG. 8) of the wafer W is exposed to the air, heat may be continuously supplied to maintain a constant temperature. The optical device 300 disposed in the test chamber 100 may be maintained at a low temperature in order to secure image quality.

Accordingly, even though heat is dissipated from the semiconductor device to be analyzed, heat transfer into the test chamber 100 may be minimized. In order to perform OFI analysis in a desired temperature range (e.g., a high temperature range), the temperature control device 200 may use the thermoelectric devices 210 so as not to affect the image quality of the OFI, and thus, the wafer W may be locally heated and at the same time the temperature change (e.g., temperature rise or fall) of the optical lens may be minimized.

Hereinafter, the temperature control device will be explained in detail.

Figure 6:
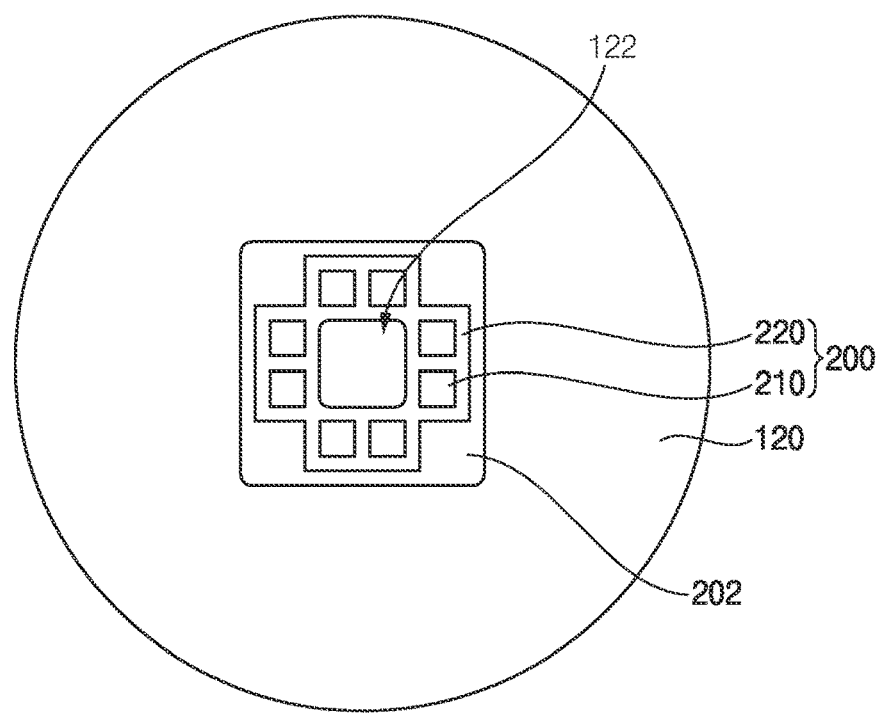
FIG. 6 is a diagram illustrating a substrate plate provided with a temperature control device in accordance with an example embodiment.
Figure 7:
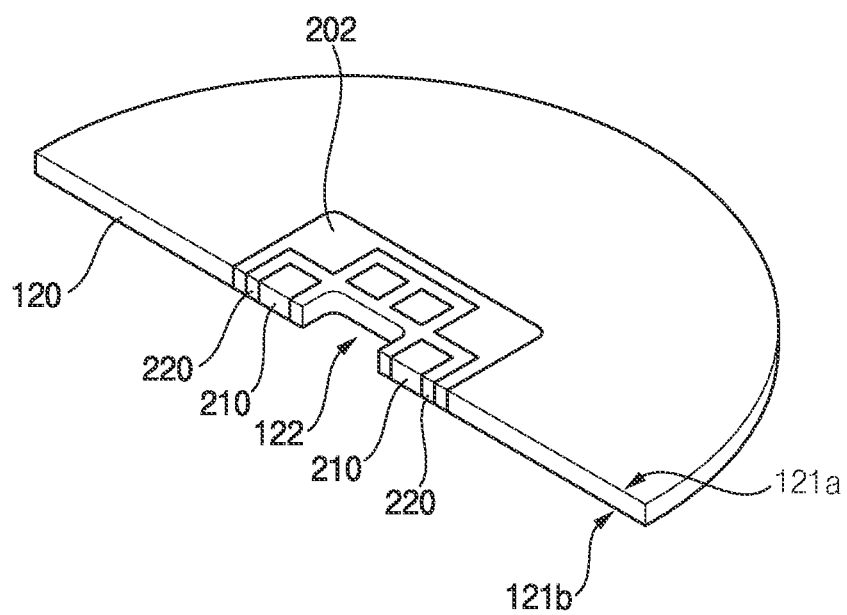
FIG. 7 is a diagram illustrating a substrate plate in accordance with an example embodiment.
Figure 8:
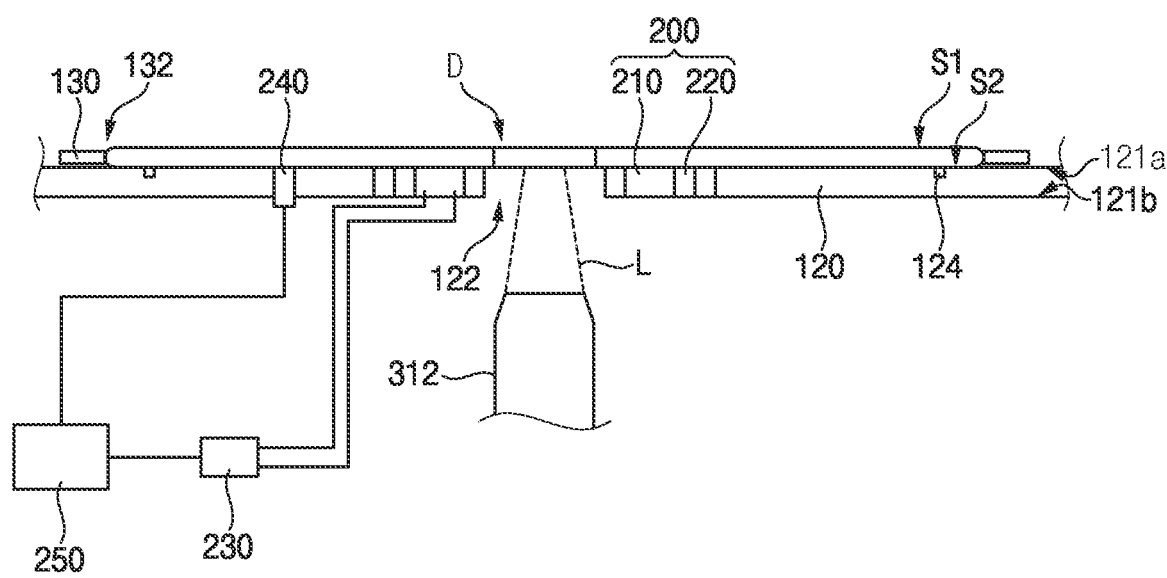
FIG. 8 is a cross-sectional view taken along line A-A' of FIG. 3 in accordance with an example embodiment.
Figure 9:
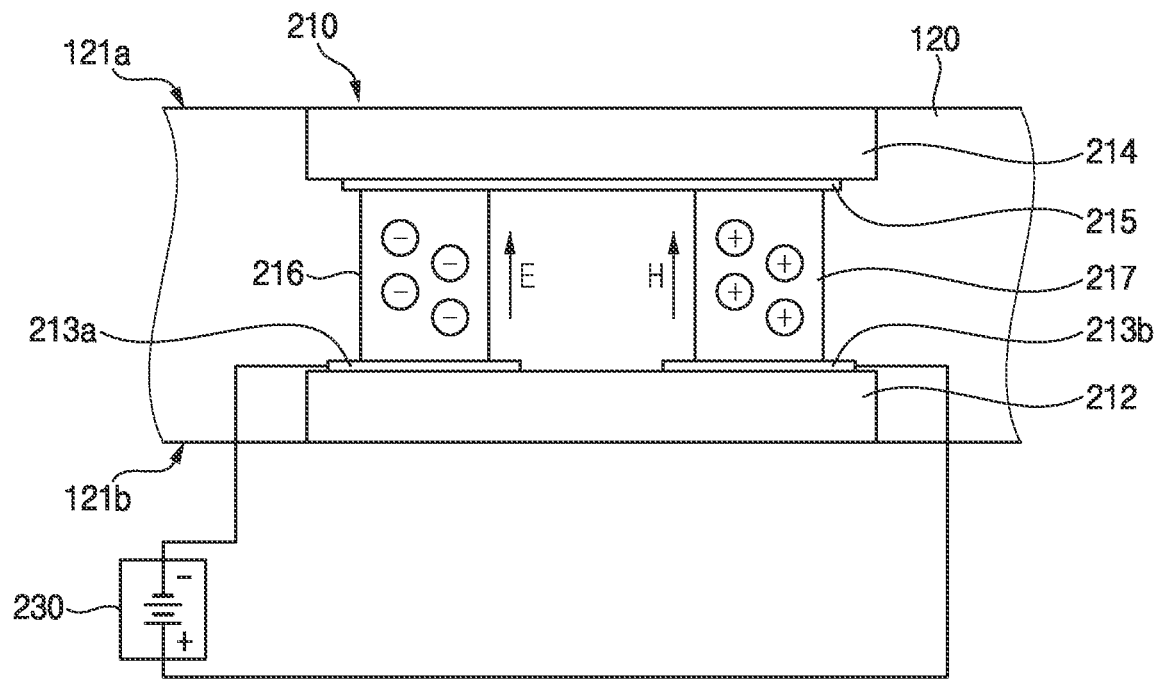
FIG. 9 is a cross-sectional view illustrating a thermoelectric device in accordance with an example embodiment.

FIG. 6 is a diagram illustrating a substrate plate provided with a temperature control device in accordance with an example embodiment. FIG. 7 is a diagram illustrating a substrate plate in accordance with an example embodiment. FIG. 8 is a cross-sectional view taken along line A-A' of FIG. 3 in accordance with an example embodiment. FIG. 9 is a cross-sectional view illustrating a thermoelectric device in accordance with an example embodiment.

Referring to FIGS. 6 to 9, a temperature control device 200 may include a plurality of thermoelectric devices 210 provided on a substrate plate 120 and disposed around an optical window 122. Additionally, the temperature control device 200 may further include a thermal insulating member 220 disposed adjacent to the thermoelectric device 210.

The temperature control device 200 may include a thermal insulating plate 202 having the optical window 122 in a central region and a plurality of the thermoelectric devices 210 provided in the thermal insulating plate 202. The thermal insulating plate 202 may include a gasket as the thermal insulating member 220. The gasket 220 may be provided to surround at least one side surface of the thermoelectric device 210. The thermal insulating plate 202 may be mounted in the central region of the substrate plate 120, and a plurality of the thermoelectric devices 210 may be provided in the gasket 220. Accordingly, the gasket 220 may be disposed to surround the sidewalls of the thermoelectric elements 210 to serve as the thermal insulating member. The thermal insulating plate 202 may be detachably mounted in the substrate plate 120. The optical window 122 may be provided in a central region of the thermal insulating plate. For example, the gasket may include a heat-resistant silicon material.

As illustrated in FIGS. 8 and 9, each of the thermoelectric devices 210 may include a heat dissipating portion 214 provided in a first surface 121a of the substrate plate 120 and a heat absorbing portion 212 provided in a second surface 121b of the substrate plate 120. When a voltage is applied to both terminals of the thermoelectric device 210 by a direct current (DC) power supply 230, the heat absorbing portion 212 may absorb heat from below the substrate plate 120, and the heat dissipating portion 214 may radiate the heat transferred from the heat absorbing portion 212, to the semiconductor device of the wafer W. The heat dissipating portion 214 and the heat absorbing portion 212 may include a ceramic layer. For example, a temperature difference between the heat dissipating portion 214 and the heat absorbing portion 212 may be within a range of about 40° C. to about 70° C.

The thermoelectric device 210 may include at least one pair of n-type semiconductor 216 and a p-type semiconductor 217 connected in series. The n-type semiconductor 216 may be obtained by mixing a trace amount of a pentavalent atom into an atom having four valence electrons, and may conduct electricity by excess electrons. The p-type semiconductor 217 may be obtained by mixing a trace amount of a trivalent atom into an atom having four valence electrons, and may conduct electricity through electron holes.

A first metal plate 213 may include a portion 213a adhered to an end portion of the n-type semiconductor 216 and a portion 213b adhered to an end portion of the p-type semiconductor 217. Another metal plate 215 may be adhered to an end portion of the n-type semiconductor 216 and an end portion of the p-type semiconductor 217. The metal plates 213 and 215 may be connected in series with the DC power supply 230 by a conductive wire. When a direct current is applied to the conductive wire in a counterclockwise direction, electrons of the n-type semiconductor 216 may move in a direction (e.g., the E direction) opposite to the flow direction of current, and the electron holes of the p-type semiconductor 217 may move in a direction (e.g., the H direction) the same as the flow direction of current. At this time, the electron holes may serve to transport heat in the H direction between the metal plates 213 and 215. Accordingly, the heat absorbing portion 212 may absorb heat from the surroundings, and the heat energy absorbed through the heat absorbing portion 212 may move to the heat dissipating portion 214 by the electron holes to be dissipated to the outside.

In example embodiments, the temperature control device 200 may include a temperature sensor 240 for detecting a temperature of the substrate plate 120 and a controller 250 configured to control operations of the thermoelectric devices 210 based on the temperature detected from the temperature sensor 240.

The temperature sensor 240 may be installed in the substrate plate 120 adjacent to the thermoelectric devices 210. The temperature sensor 240 may be installed to be in contact with or adjacent to the wafer W to detect a temperature of a semiconductor device formed on the wafer W. Alternatively, a temperature measurement portion of the automated test system (ATE) may measure the temperature of the semiconductor device.

The controller 250 may control the operation of the thermoelectric elements 210 by controlling the DC power supply 230 based on the detected temperature. Accordingly, an operating time of the thermoelectric devices 210 may be adjusted to increase the temperature of the semiconductor device to a desired temperature range.

For example, the semiconductor device of the wafer W may be heated to a high temperature range of about 85° C. to about 110° C. by the thermoelectric devices 210 of the temperature control device 200. Accordingly, the optical device 300 may perform the OFI analysis under a high temperature range by imaging the rear surface S2 of the wafer W exposed through the optical window 122 of the substrate plate 120.

In example embodiments, the functions of the heat absorbing portion 212 and the heat dissipating portion 214 may be exchanged by switching the direction of the DC current applied by the DC power source 230 to the opposite direction (e.g., in a clockwise direction). For example, the direction of the DC current applied to the DC power supply 230 may be changed by the controller 250.

When the direction of the DC current applied from the DC power source 230 is clockwise, the electron holes may move in the direction opposite to the H direction to carry heat. Accordingly, the heat dissipating portion 214 may be a heat absorbing portion that absorbs heat from the surroundings, and the heat absorbing portion 212 may be a heat dissipating portion that radiates heat to the surroundings.

In this case, the heat dissipating portion 214 may absorb heat from the wafer W, and the heat absorbing portion 212 may radiate heat transferred from the heat dissipating portion 214, to the air below the substrate plate 120. For example, the semiconductor device of the wafer W may be cooled to a low temperature range of about −20° C. to about −5° C. by the thermoelectric devices 210 of the temperature control device 200.

The optical defect detection system 10 may include the test chamber 100 having the upper cover 112 in which the substrate plate 120 having the optical window 122 is mounted, the temperature control device 200 provided in the substrate plate 120 and including a plurality of the thermoelectric devices 210 disposed around the optical window 122, and the optical device 300 disposed in the test chamber 100 and configured to radiate light toward at least one semiconductor device exposed through the optical window 122 and analyze the reflected light.

The wafer W on which a plurality of semiconductor devices are formed may be supported on the substrate plate 120, and a semiconductor device to be tested among the semiconductor devices may be disposed to be exposed by the optical window 122. The semiconductor device to be tested may be heated or cooled by the thermoelectric devices 210 to a desired high or low temperature range, and the OFI analysis may be performed under the high or low temperature range. Accordingly, strict reliability evaluation in a high or low temperature range may be performed.

Figure 10:
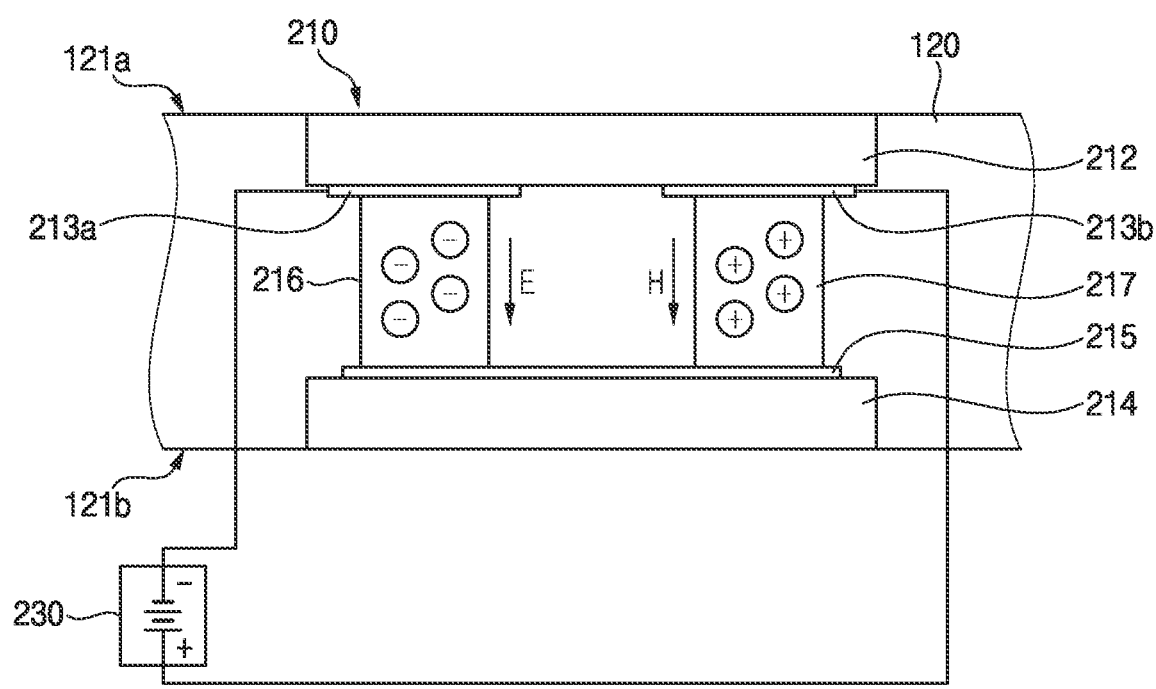
FIG. 10 is a cross-sectional view illustrating a thermoelectric device in accordance with an example embodiment.

FIG. 10 is a cross-sectional view illustrating a thermoelectric device in accordance with an example embodiment.

Referring to FIG. 10, the thermoelectric device 210 may include a heat absorbing portion 212 provided in a first surface 121a of a substrate plate 120 and a heat dissipating portion 214 provided in a second surface 121b of the substrate plate 120. When a voltage is applied to both terminals of the thermoelectric device 210 by a DC power supply 230, the heat absorbing portion 212 may absorb heat from the wafer W and the heat dissipating portion 214 may radiate the heat transferred from the heat absorbing portion 212 to the air below the substrate plate 120.

For example, a semiconductor element of a wafer W may be cooled to a low temperature range of about −20° C. to about −5° C. by the thermoelectric devices 210 of a temperature control device 200. Accordingly, the OFI analysis may be performed under the low temperature range.

Hereinafter, an optical defect detection method for a semiconductor device using the optical defect detection system of FIG. 1 will be explained.

Figure 11:
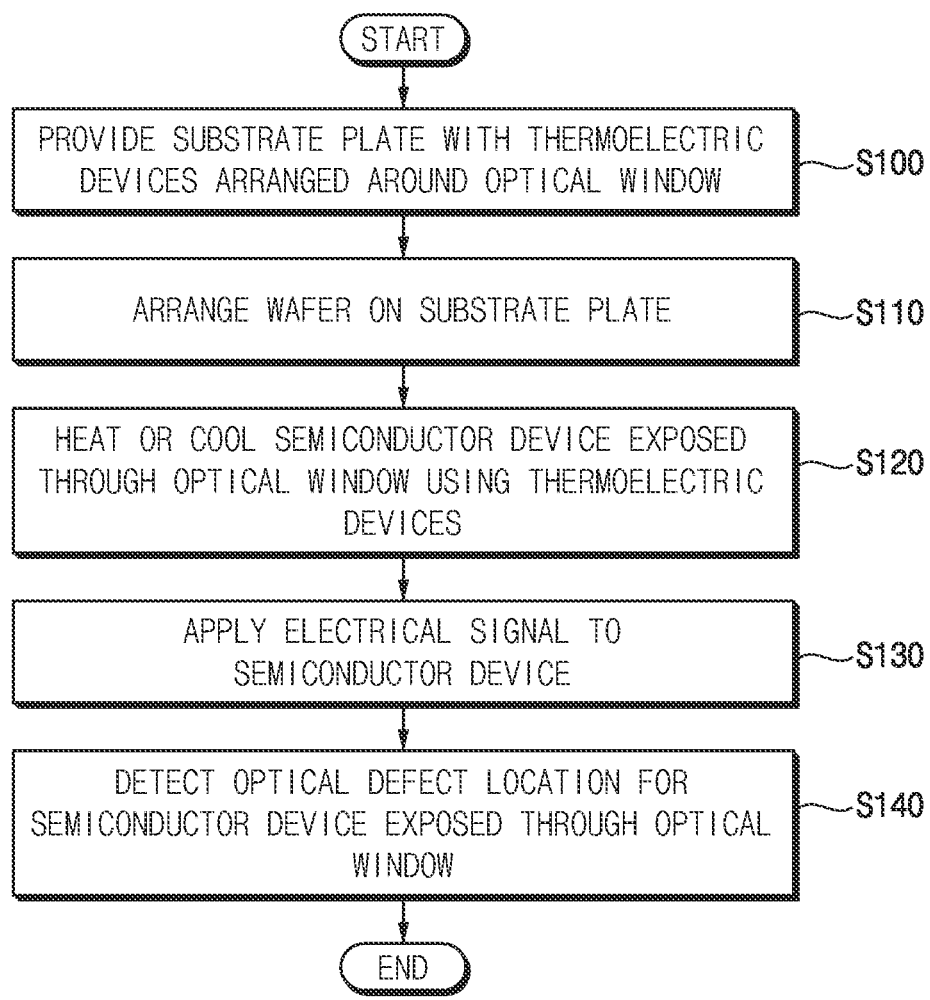
FIG. 11 is a flowchart illustrating an optical defect detection method in accordance with an example embodiment.

FIG. 11 is a flowchart illustrating an optical defect detection method in accordance with an example embodiment.

FIGS. 1 to 11, in operation S100, a substrate plate 120 having thermoelectric devices 210 that are disposed around an optical window 122 may be provided, and in operation S110, a wafer W may be arranged on the substrate plate 120.

In example embodiments, the substrate plate 120 may be mounted in an upper cover 112 of a test chamber 100. The optical window 122 may be provided in a central region of the substrate plate 120. A plurality of the thermoelectric elements 210 of a temperature control device 200 may be provided on the substrate plate 120 and disposed around the optical window 122.

The wafer W on which a plurality of semiconductor devices to be tested is formed may be held by a transfer arm 130 and moved onto the substrate plate 120. A plurality of suction holes 124 may be formed in an upper surface of the substrate plate 120. The wafer W may be vacuum-adsorbed by the suction holes 124 formed in the substrate plate 120. Accordingly, the wafer W may be supported on the substrate plate 120. In this case, a semiconductor device to be tested among the plurality of semiconductor devices may be arranged to be exposed through the optical window 122.

In operation S120, the semiconductor device exposed through the optical window 122 may be heated or cooled using the thermoelectric devices 210 to maintain a desired temperature range.

As illustrated in FIG. 9, the thermoelectric device 210 may include the heat dissipating portion 214 provided in the first surface 121a of the substrate plate 120 and the heat absorbing portion provided in the second surface 121b of the substrate plate 120. In this case, when a voltage is applied to both terminals of the thermoelectric device 210 by the DC power supply 230, the heat absorbing portion 212 of the thermoelectric device 210 may absorb heat from the air below the substrate plate 120 and the heat dissipating portion 214 may receive heat from the heat absorbing portion 212 and may radiate the heat to the semiconductor device of the wafer W. Thus, the semiconductor device may be heated to a high temperature range of about 85° C. to about 110° C. by the thermoelectric devices 210.

As illustrated in FIG. 10, the thermoelectric device 210 may include the heat absorbing portion 212 provided in the first surface 121a of the substrate plate 120 and the heat dissipating portion 214 provided in the second surface 121b of the substrate plate 120. When a voltage is applied to both terminals of the thermoelectric device 210 by the DC power supply 230, the heat absorbing portion 212 may absorb heat from the wafer W and the heat dissipating portion 214 may radiate the heat transferred from the heat absorbing portion 212 to the air below the substrate plate 120. Thus, a semiconductor device of the wafer W may be cooled to a low temperature range of about −20° C. to about −5° C. by the thermoelectric devices 210 of the temperature control device 200. Accordingly, the OFI analysis may be performed under the low temperature range.

In example embodiments, operations of the thermoelectric device 210 may be controlled based on the temperature of the wafer. For example, the operations of the thermoelectric device 210 may be controlled based on the temperature detected by the temperature sensor 240 mounted in the substrate plate 120. The controller 250 may control the DC power supply 230 based on the temperature detected by the temperature sensor 240 to adjust operating times of the thermoelectric devices 210, to thereby change the temperature of the semiconductor device to a desired temperature range.

In operation S130, an electrical signal may be applied to the semiconductor device, and, in operation S140, an optical defect location for the semiconductor device exposed through the optical window may be detected. For example, an optical image of a rear surface S2 of the semiconductor device exposed through the optical window 122 may be obtained to detect an optically defective position.

In example embodiments, OFI may be performed in a driving state of the semiconductor device in conjunction with an ATE under the high or low temperature range.

In particular, a tester head 520 may be electrically connected to a probe card 400 above the test chamber 100, and may transmit an electrical signal between the probe card 400 and a tester body 510. In a state in which the probe card 400 is coupled to an interface module 530, the probe card 400 may move toward the wafer W, and probes 402 of the probe card 400 may make contact with electrode pads P of the wafer W placed on the substrate plate 120.

An electrical signal from the tester body 510 may be sequentially transmitted to the probe card 400 via pogo pins of the tester head 520 and the interface module 530.

The optical device 300 may be disposed within a receiving space S of the test chamber 100, may radiate light toward at least one semiconductor device exposed through the optical window 122 of the substrate plate 120, and may detect a defective position from the reflected light. The optical device 300 may perform the OFI while the electrical signal is applied to the semiconductor device.

For example, the OFI method may include a photon detection optical technique (e.g., photon emission microscopy (PEM)), a dynamic laser stimulation technique (e.g., dynamic laser stimulation (DLS)), a laser frequency detection technique (e.g., laser voltage probing (LVP)), etc.

In PEM, an optical device may detect photons emitted when a voltage is applied to a transistor of a semiconductor device and current flows. An abnormal current flow according to a current leakage path and a floating node of a faulty circuit may be tracked through near-infrared imaging using an optical lens. In DLS, when a laser in the near-infrared range is radiated to locally change a voltage/current characteristic of a semiconductor device, whether or not a circuit operation is defective may be determined to detect a defective location. In LVP, by radiating a laser to a semiconductor device and converting the reflectance of the reflected laser into a signal form, it may be possible to detect a defect by observing the waveform of the internal circuit.

Electronic semiconductor products must operate normally even in extreme heat or extreme cold in which vehicles are operated. Since, due to the characteristics of semiconductors, as the temperature rises the threshold voltage and current decreases and the leakage current increases, defects that are not a problem at room temperature may cause malfunctions at high temperatures.

In example embodiments, after performing the optical failure analysis on a specific semiconductor device in the wafer, the wafer may be moved on the substrate plate 120 to perform optical failure analysis on another semiconductor device in the same wafer. Since it is possible to analyze another semiconductor device in the same wafer by moving only the die in the wafer, analysis time may be reduced and massive analysis may be possible.

As described above, the optical defect detection may be performed while the semiconductor device to be tested is heated or cooled by the thermoelectric devices 210 to be maintained in a desired high or low temperature range. Accordingly, strict reliability evaluation in a high or low temperature range may be performed.

According to this optical defect analysis method, it may be possible to detect major defects that occur in high-temperature tests of electronic products or application processors (Aps) that require operation in a high-temperature environment, and may be used to reveal the cause of defects that occur in tests under various harsh conditions, such as burn-in and high temperature tests to ensure quality, so that product quality may be improved and yields may be improved.

The semiconductor device may include logic devices or memory devices. The semiconductor device may include logic devices such as central processing units (CPUs), main processing units (MPUs), or APs, or the like, and volatile memory devices such as dynamic random access memory (DRAM) devices, HBM devices, or non-volatile memory devices such as flash memory devices, phase-change RAM (PRAM) devices, magnetoresistive RAM (MRAM) devices, resistive RAM (ReRAM) devices, or the like.

Although the disclosure been described in connection with some embodiments illustrated in the accompanying drawings, it will be understood by one of ordinary skill in the art that variations in form and detail may be made therein without departing from the spirit and essential feature of the disclosure. The above disclosed embodiments should thus be considered illustrative and not restrictive.

What is claimed is:

1. An optical failure detection system comprising:
   a test chamber having an accommodating space therein, the test chamber comprising an upper cover having an opening therein;
   a substrate plate provided in the opening of the upper cover, the substrate plate comprising:
   a first surface on which a wafer is disposed;
   a second surface opposite to the first surface; and
   an optical window formed in a central region of the substrate plate and through which the wafer is exposed;
   a temperature control device comprising a plurality of thermoelectric devices provided around the optical window of the substrate plate, the temperature control device being configured to heat or cool at least one semiconductor device of the wafer; and
   an optical device provided in the accommodating space of the test chamber, the optical device being configured to:
   radiate light toward the at least one semiconductor device through the optical window, and
   analyze light reflected from the at least one semiconductor device.

2. The optical failure detection system of claim 1, wherein each of the plurality of thermoelectric devices comprises:
   a heat dissipating portion provided in one of the first surface and the second surface of the substrate plate; and
   a heat absorbing portion provided in the other one of the first surface and the second surface of the substrate plate.

3. The optical failure detection system of claim 1, wherein each of the plurality of thermoelectric devices comprises:
   an n-type semiconductor and a p-type semiconductor connected in series;
   a first metal plate provided at a first end of the n-type semiconductor and a first end of the p-type semiconductor;
   a second metal plate provided at a second end of the n-type semiconductor and a second end of the p-type semiconductor;
   a heat absorbing portion provided on the first metal plate; and
   a heat dissipating portion provided on the second metal plate,
   wherein, when a direct current flows through the n-type semiconductor and the p-type semiconductor by the first metal plate and the second metal plate, the heat absorbing portion absorbs heat, and the heat absorbed through the heat absorbing portion is transferred to the heat dissipating portion to be dissipated to an outside of the temperature control device.

4. The optical failure detection system of claim 1, wherein the temperature control device further comprises a thermal insulating member that is adjacent to at least one of the plurality of thermoelectric devices.

5. The optical failure detection system of claim 4, wherein the thermal insulating member comprises a gasket surrounding at least one side surface of the at least one of the plurality of thermoelectric devices.

6. The optical failure detection system of claim 1, wherein a diameter of the optical window is within a range of about 1 cm to about 5 cm.

7. The optical failure detection system of claim 1, further comprising:
   a temperature sensor provided in the substrate plate; and
   a controller configured to control operations of the plurality of thermoelectric devices based on a temperature detected by the temperature sensor.

8. The optical failure detection system of claim 1, further comprising:
   a transfer arm configured to transfer the wafer over the substrate plate while holding the wafer.

9. The optical failure detection system of claim 1, wherein the optical device comprises an optical microscope using a laser light source.

10. The optical failure detection system of claim 1, further comprising:
    a probe card provided above the test chamber and contacting the at least one semiconductor device; and
    a tester configured to:
    transmit an electrical signal to the probe card, and
    inspect electrical characteristics of the at least one semiconductor device based on a response signal to the electrical signal.

11. An optical failure detection system comprising:
    a test chamber having an accommodating space therein, the test chamber comprising an upper cover;
    a substrate plate provided in the upper cover, the substrate plate comprising an optical window;
    a temperature control device provided in the substrate plate, the temperature control device comprising a plurality of thermoelectric devices provided around the optical window of the substrate plate, and the temperature control device being configured to heat or cool at least one semiconductor device of a wafer that is disposed on the substrate plate and exposed through the optical window; and an optical device provided within the accommodating space of the test chamber, the optical device configured to:
radiate light toward the at least one semiconductor device through the optical window, and
analyze light reflected from the at least one semiconductor device.

12. The optical failure detection system of claim 11, wherein each of the plurality of thermoelectric devices comprises:
a heat dissipating portion provided in one of a first surface of the substrate plate and the second surface of the substrate plate opposite to the first surface; and
a heat absorbing portion provided in the other one of the first surface the second surface of the substrate plate that is opposite to the first surface.

13. The optical failure detection system of claim 11, wherein each of the plurality of thermoelectric devices comprises:
an n-type semiconductor and a p-type semiconductor connected in series;
a first metal plate provided at a first end of the n-type semiconductor and a first end of the p-type semiconductor;
a second metal plate provided at a second end of the n-type semiconductor and a second end of the p-type semiconductor;
a heat absorbing portion provided on the first metal plate; and
a heat dissipating portion provided on the second metal plate, and
wherein, when a direct current flows through the n-type semiconductor and the p-type semiconductor by the first metal plate and the second metal plate, the heat absorbing portion absorbs heat, and the heat absorbed through the heat absorbing portion is transferred to the heat dissipating portion to be dissipated to an outside of the temperature control device.

14. The optical failure detection system of claim 11, wherein the temperature control device further comprises a thermal insulating member that is adjacent to at least one of the plurality of thermoelectric devices.

15. The optical failure detection system of claim 11, further comprising:
a temperature sensor provided in the substrate plate; and
a controller configured to control operations of the plurality of thermoelectric devices based on a temperature detected from the temperature sensor.

16. An optical failure detection method comprising:
arranging a wafer on a substrate plate provided in an upper cover of a test chamber, the substrate plate comprising an optical window;
heating or cooling, by at least one of a plurality of thermoelectric devices provided around the optical window of the substrate plate, at least one semiconductor device of the wafer exposed through the optical window;
applying an electrical signal to the at least one semiconductor device; and
detecting, by an optical device provided within the test chamber, an optically defective position of the at least one semiconductor device exposed through the optical window.

17. The method of claim 16, wherein the heating or cooling the at least one semiconductor device comprises applying a voltage to at least one of the plurality of thermoelectric devices by a direct current (DC) power source connected to each of the plurality of thermoelectric devices.

18. The method of claim 16, wherein the heating or cooling the at least one semiconductor device comprises:
detecting a temperature of the at least one semiconductor device from a temperature sensor provided in the substrate plate; and
controlling operations of the plurality of thermoelectric devices based on the detected temperature.

19. The method of claim 16, wherein the applying the electrical signal to the at least one semiconductor device comprises:
contacting a probe card with the wafer on the substrate plate; and
transmitting the electrical signal to the probe card.

20. The method of claim 16, wherein the optical device comprises an optical microscope using a laser light source.

* * * * *